United States Patent
Noguchi

(12) 
(10) Patent No.: US 7,176,100 B2
(45) Date of Patent: Feb. 13, 2007

(54) CAPACITOR AND ITS MANUFACTURING METHOD, AND SEMICONDUCTOR DEVICE

(75) Inventor: Motohisa Noguchi, Suwa (JP)

(73) Assignee: Seiko Epson Corporation (JP)

( * ) Notice: Subject to any disclaimer, the term of this patent is extended or adjusted under 35 U.S.C. 154(b) by 99 days.

(21) Appl. No.: 11/046,654

(22) Filed: Jan. 28, 2005

(65) Prior Publication Data

US 2005/0186752 A1    Aug. 25, 2005

(30) Foreign Application Priority Data

Jan. 29, 2004    (JP)    ............................ 2004-020892

(51) Int. Cl.
*H01L 21/20* (2006.01)
(52) U.S. Cl. ............... 438/387; 438/3; 438/240; 438/381; 438/396; 438/782; 438/785; 257/E21.009
(58) Field of Classification Search .............. 438/3, 438/240, 381, 782, 785, 387, 396; 257/E21.009, 257/E21.01
See application file for complete search history.

(56) References Cited

U.S. PATENT DOCUMENTS

| 6,740,532 B2 | 5/2004 | Fujimori | 438/3 |
| 2004/0121492 A1* | 6/2004 | Lee et al. | 438/3 |

FOREIGN PATENT DOCUMENTS

| JP | 62-148213 | 7/1987 |
| JP | 05-047587 | 2/1993 |
| JP | 05-082801 | 4/1993 |
| JP | 07-226485 | 8/1995 |
| JP | 09-139480 | 5/1997 |
| JP | 2001-053071 | 2/2001 |
| JP | 2003-060168 | 2/2003 |
| JP | 2003-086584 | 3/2003 |
| JP | 2003-297823 | 10/2003 |

OTHER PUBLICATIONS

Communication from Japanese Patent Office regarding counterpart application, (J0105704).

* cited by examiner

*Primary Examiner*—George R. Fourson
*Assistant Examiner*—Julio J. Maldonado
(74) *Attorney, Agent, or Firm*—Harness, Dickey & Pierce, P.L.C.

(57) ABSTRACT

A method is provided for manufacturing a capacitor including the steps of forming a lower electrode on a substrate, forming an insulation film formed of a perovskite type metal oxide on the lower electrode, and forming an upper electrode on the insulation film. The step of forming the insulation film includes the steps of coating a dispersion liquid in which fine crystal powder of a second metal oxide of a perovskite type in a liquid containing a precursor compound of a first metal oxide of a perovskite type on the lower electrode, and performing a heat treatment of the dispersion liquid after coating.

8 Claims, 5 Drawing Sheets

CAPACITOR AND ITS MANUFACTURING METHOD, AND SEMICONDUCTOR DEVICE

RELATED APPLICATIONS

This application claims priority to Japanese Patent Application No. 2004-020892 filed Jan. 29, 2004 which is hereby expressly incorporated by reference herein in its entirety.

BACKGROUND

1. Technical Field

The present invention relates to a method for manufacturing a capacitor and a capacitor obtained by the method, and a semiconductor device equipped with the capacitor.

2. Related Art

Various kinds of capacitors are used in semiconductor devices as their constituent elements (see, for example, Japanese Laid-open Patent Applications HEI 7-226485, HEI 9-139480, HEI 5-82801, and HEI 5-47587). For example, capacitors are used in oscillation circuits, power supply circuits and the like in semiconductor devices for the purpose of prevention, stabilization and smoothing of oscillations of operation amplifiers, for voltage step-up circuits, and the like.

Such capacitors often use a structure, in the case where they are fabricated inside circuits, in which an insulation film (dielectric film), such as, a silicon oxide film, silicon nitride film, silicon oxinitride film or the like is sandwiched between upper and lower electrode films composed of silicon or metal, or titanium nitride, aluminum nitride or the like. Also, in the case where they are attached externally to circuits or the like, capacitors such as laminated capacitors equipped with ceramics insulation films (dielectric films), such as, barium titanate films or the like are known.

When such capacitors are fabricated, in particular, when their insulation films are formed, a sputter method, a CVD method, a laser ablation method or the like is normally employed.

It is noted that the capacity of a capacitor is in proportion to the dielectric constant and area of an insulation film (dielectric film) thereof, and in reverse proportion to the thickness of the insulation film. Accordingly, when capacitors of a small size and high capacity are desired to be formed inside circuits, their insulation films (dielectric films) may preferably be formed from a material having a high dielectric constant in view of leak current, to thereby achieve a high capacity. On the other hand, when capacitors are externally mounted, it is desirous if they can be readily fabricated with thin films as there are demands to lower assembly costs, and improve the yield.

Under such circumferences, the dielectric constant of an insulation film (dielectric film) of a capacitor may preferably be 300 or greater in the case of internal circuits, and 1000 or greater in the case of externally attached type, in consideration of its area and film thickness.

However, the capacitor fabricated inside the circuit described above uses a silicon oxide film, a silicon nitride film, or a silicon oxinitride film as an insulation film, and these insulation films (dielectric films) have low dielectric constants, which are 10 or below. Accordingly, it may be necessary to increase its area to increase its capacity. However, when the area of the capacitor is increased, an area occupied by the capacitor in the circuit becomes larger, which would prevent miniaturization of the circuit.

As insulation materials having a high dielectric constant, ferroelectric materials, such as, for example, lead zirconate titanate (PZT), barium titanate and the like are known. Film forming temperature for those ferroelectric materials needs to be 450° C. or lower in view of its influence to other semiconductor elements and wirings provided in the same semiconductor device. However, because crystallization is difficult to take place at such a low temperature, the resultant ferroelectric film obtained may not attain a desired level of high dielectric constant, although it may have a relatively high dielectric constant compared to silicon oxide films. Also, the dielectric constant changes greatly against changes in frequency and temperature, and therefore the ferroelectric film may be inferior compared to silicon oxide films.

Also, in the method for manufacturing such capacitors, in particular, because their insulation films are formed by a sputter method, a CVD method, a laser ablation method or the like, there are problems in that a large scale film forming apparatus is necessary, which requires a high initial cost, and a large amount of energy is necessary for film formation, which requires a high running cost. Also, when patterning is conducted by etching after film formation, there are problems in that the material usage efficiency is poor, and photolithography masks and chemicals for etchings are necessary, which result in a higher cost, and the number of steps increases, which lowers the productivity.

On the other hand, when capacitors composed of ceramics such as barium titanate or the like that are externally mounted are formed, although the cost of the capacitors themselves may be lowered, the assembly cost is required for positioning at the time of external mounting, bonding with other elements and the like, and there are problems in the yield, such that a sufficient cost reduction has not been achieved.

The present invention has been made in view of the problems described above, and its object is to provide a method for manufacturing a capacitor by which capacitors can be manufactured at a low cost, capacitors obtained by the manufacturing method, and semiconductor devices equipped with the capacitors.

SUMMARY

A method for manufacturing a capacitor, which achieves the object described above, is characterized in comprising the steps of forming a lower electrode above a base substrate;

forming an insulation film formed of a perovskite type metal oxide on the lower electrode; and forming an upper electrode on the insulation film, wherein the step of forming the insulation film includes the steps of coating a dispersion liquid in which fine crystal powder of a second metal oxide of a perovskite type in a liquid containing a precursor compound of a first metal oxide of a perovskite type on the lower electrode, and performing a heat treatment of the dispersion liquid after coated.

According to the method for manufacturing a capacitor, the fine crystal powder of the second metal oxide is dispersed in a liquid containing the precursor compound of the first metal oxide, and the dispersion liquid is coated on the lower electrode, thereby forming the insulation film. Accordingly, when the dispersion liquid is heat-treated for crystallization to form an insulation film formed of a metal oxide of a perovskite type, the fine crystal powder of the second metal oxide added becomes a seed crystal, such that crystallization of the precursor compound in the dispersion liquid into the first metal oxide is promoted, or crystallization at low temperatures becomes possible which results in promotion of crystallization.

Also, in the method for manufacturing a capacitor described above, an element composition of the first metal oxide may be equal to an element composition of the fine crystal powder of the second metal oxide.

As a result, when the dispersion liquid is heat-treated for crystallization to form an insulation film formed of a metal oxide of a perovskite type, in particular, the fine crystal powder of the second metal oxide added becomes a seed crystal, such that crystallization of the precursor compound in the dispersion liquid into the first metal oxide is quickened, and therefore the crystallization is promoted.

Also, in the method for manufacturing a capacitor described above, an element composition of the first metal oxide may be different from an element composition of the fine crystal powder of the second metal oxide.

Generally, the relative dielectric constant of an insulation film is mostly decided by the kind of the insulating film (dielectric film). Accordingly, in order to manufacture a capacitor having a target capacitance, it is a general practice to adjust the capacitance by changing the film thickness and/or area of its insulation film.

In contrast, in accordance with the present invention, the element composition of the first metal oxide is different from the element composition of the fine power of crystal of the second metal oxide, such that the relative dielectric constant of an insulation film to be obtained can be adjusted by appropriately selecting the element composition and/or the amount of the fine crystal powder of the second metal oxide. As a result, insulation films (dielectric films) having the same film thickness and area can be formed to have different electric capacities.

In the method for manufacturing a capacitor, the first metal oxide may be formed of an element composition that does not include Pb, and the second metal oxide may be formed of an element composition that includes Pb.

It is known that a perovskite type metal oxide including Pb has a crystallization temperature lower than a non-lead system perovskite type metal oxide. Therefore, according to the method, when the precursor compound of the first metal oxide is thermally treated to be crystallized, its crystallization temperature, in other words, its sintering temperature can be lowered and, as a result, the crystallization is promoted.

Also, in the method for manufacturing a capacitor, the fine crystal powder of the second metal oxide may include fine crystal powder of a metal oxide having an element composition identical with the element composition of the first metal oxide, and fine crystal powder of a metal oxide having an element composition different from the element composition of the first metal oxide.

As a result, when the dispersion liquid is thermally treated for crystallization to form an insulation film formed of a metal oxide of a perovskite type, in particular, among the fine crystal powder of the second metal oxide added, the fine crystal powder of the metal oxide having the element composition identical with the element composition of the first metal oxide becomes a seed crystal, such that crystallization of the precursor compound in the dispersion liquid into the first metal oxide is quickened, and therefore the crystallization is promoted. Also, the relative dielectric constant of an insulation film to be obtained can be adjusted by appropriately selecting the element composition and/or the amount of the fine crystal powder of the metal oxide having the element composition different from the element composition of the first metal oxide. As a result, insulation films (dielectric films) having the same film thickness and area can be formed to have different electric capacities.

In the method for manufacturing a capacitor, the first metal oxide may be formed of an element composition that does not include Pb, and the fine crystal powder of the metal oxide having the element composition different from the element composition of the first metal oxide, among the fine crystal powder of the second metal oxide, may have an element composition that includes Pb.

As a result, when the precursor compound of the first metal oxide is thermally treated to be crystallized, its crystallization temperature, in other words, its sintering temperature can be lowered and, as a result, the crystallization is promoted.

Also, in the method for manufacturing a capacitor, an average grain size of the fine crystal powder of the second metal oxide may preferably be 80% or less, more preferably, 50% or less of a thickness of the insulation film to be formed.

As a result, crystal fine particles in the insulation film to be formed are prevented from being exposed on the film surface, and the film quality such as flatness, etc. can be prevented from being damaged. Also, in particular, when the grain size is 50% or less of the thickness of the insulation film, the preventive effect described above becomes more secured, and the film quality can be stabilized.

Also, in the method for manufacturing a capacitor, the step of coating the dispersion liquid on the lower electrode may preferably be performed by discharging the dispersion liquid by a droplet discharge method to thereby dispose the dispersion liquid on the lower electrode.

Accordingly, after the dispersion liquid has been disposed by a droplet discharge method, the same is thermally treated to form an insulation film, such that a large-scale film forming apparatus is not required, and the method becomes advantageous also in material usage efficiency and energy consumption, such that the cost can be reduced. Moreover, because patterning by etching is not required as the liquid can be deposited at any desired position, no damage is caused to the insulation film, which may be caused by etching.

A capacitor in accordance with the present invention is characterized in that it is obtained by the manufacturing method described above.

Due to the fact that the capacitor is formed with a dispersion liquid containing the fine crystal powder of the second metal oxide dispersed therein, its crystallization is promoted, such that, for example, thermal influences on other semiconductor elements and wirings provided within the same semiconductor device can be reduced. Accordingly, insulation materials (dielectric materials), which are conventionally difficult to use because a high-temperature sintering is needed, can be used, and a higher capacity can be attained.

A semiconductor device in accordance with the present invention is characterized in comprising the capacitor described above.

According to the semiconductor device, when it is equipped with other semiconductor elements and wirings besides a capacitor, thermal influences on the other semiconductor elements and wirings can be reduced at the time of forming the capacitor. Also, insulation materials (dielectric materials), which are conventionally difficult to use because a high-temperature sintering is needed, can also be used, and a higher capacity of the capacitor can be attained.

DETAILED DESCRIPTION

The present invention is described below in detail.

Figure 1:
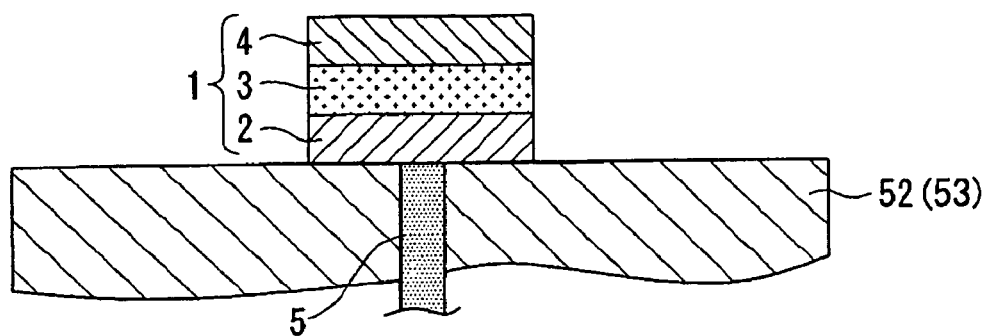
FIG. 1 is a side cross-sectional view of a capacitor in accordance with an embodiment of the present invention.
Figure 2:
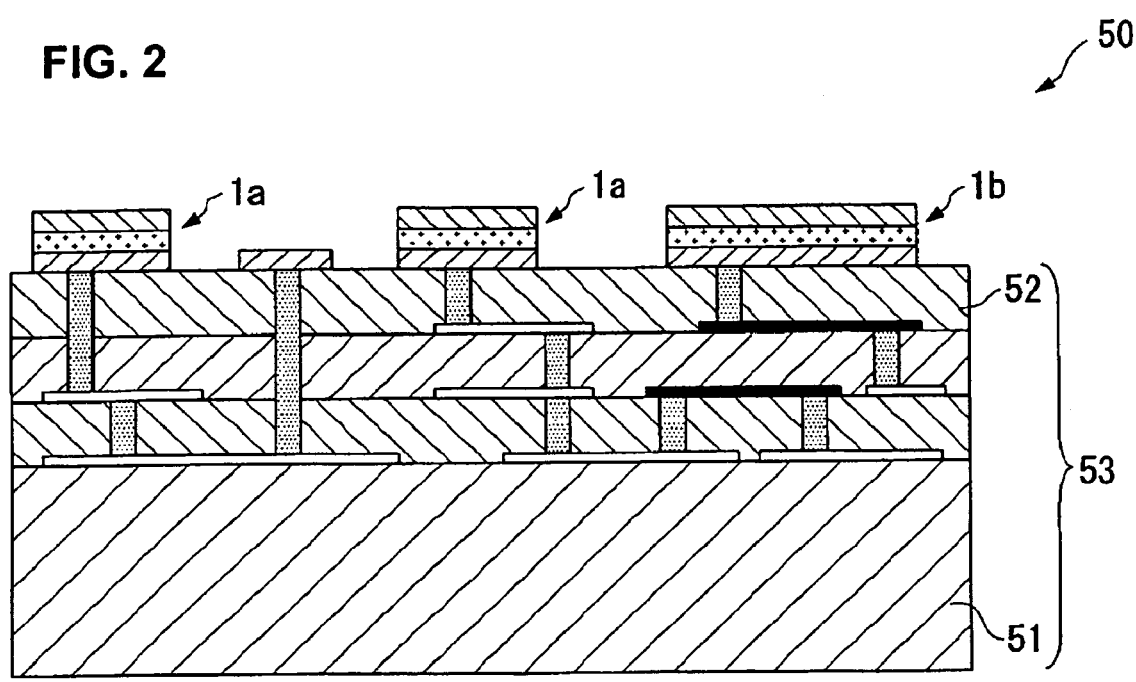
FIG. 2 is a side cross-sectional view of a semiconductor device in accordance with an embodiment of the present invention.

FIG. 1 is a view indicating a capacitor in accordance with an embodiment of the present invention, wherein reference numeral 1 in FIG. 1 denotes a capacitor. The capacitor 1 can be used, for example, in a semiconductor device 50 that is a semiconductor device in accordance with an embodiment of the present invention shown in FIG. 2, as a capacitor 1a that can be replaced with a conventional in-circuit capacitor, and also as a capacitor 1b that can be replaced with a capacitor attached externally to the circuit.

It is noted here that the semiconductor device 50 includes various transistors such as CMOS transistors and memory elements formed over a base substrate 51, and various wirings and plugs for connecting them and electrically connecting the capacitors 1a and 1b formed on interlayer insulation films or in the interlayer insulation films. It is noted that a portion up to the interlayer insulation film 52 that defines a groundwork for forming the capacitors 1a and 1b may be referred to as a substrate 53 in the present invention. Further, although not shown, protection layers and wirings may be formed over the capacitors 1a and 1b, and an insulation layer that covers them may be further formed.

A capacitor 1 used as either the capacitor 1a or 1b is formed on an interlayer insulation film 52 (substrate 53) formed of, for example, polyimide, as shown in FIG. 1, and is formed from a lower electrode 2 formed on the interlayer insulation film 52, an insulation film 3 formed on the lower electrode 2, and an upper electrode 4 formed on the insulation film 3. In other words, the capacitor 1 has a structure in which the insulation film 3 is sandwiched between the lower electrode 2 and the upper electrode 4, and the lower electrode 2 is connected to an embedded wiring 5 that is formed in the interlayer insulation film 52, and the upper electrode 4 is connected to another wiring (not shown).

The lower electrode 2 and the upper electrode 4 are both formed from metal sintered compacts that are composed of sintered metal fine particles. More specifically, they are formed from fine particles of at least one of platinum, iridium, ruthenium, gold and silver, which are sintered.

The insulation film 3 is formed from a perovskite type metal oxide, which is of a perovskite type, and contains a first metal oxide as a main component as described below, and a second metal oxide added. As the first metal oxide that forms the main component, a perovskite type metal oxide having a high dielectric constant is used. More specifically, lead titanate system materials, such as, $PbTiO_3$, $PbZrTiO_3$ (PZT), $PbLaZrTiO_3$, $PbZrTiNbO_3$, $PbZrTiTaO_3$, and $PbZrTiVO_3$, non-lead system metal oxides, such as, $BaTiO_3$, $SrTiO_3$, $CaTiO_3$, $BaSrTiO_3$, and BaCaTiO, furthermore, strontium bismuth tantalate (SBT) system materials, and bismuth titanate (BIT) system materials can be used.

Further, a perovskite type metal oxide is used for the second metal oxide that is added to the first metal oxide.

It is noted that the second metal oxide may be made of the same material as that of the first metal oxide, or may be made of a different material. In other words, the lead titanate system materials, non-lead system metal oxides, as well as, SBT system materials, and BIT system materials described above can be used as the second metal oxide. Further, in particular, the same first metal oxides may be used, or different materials may be used. It is noted that, when the second metal oxide used is different from the first metal oxide, in particular, when the first metal oxide is formed from an element composition that does not contain Pb, the second metal oxide may be formed from an element composition that includes Pb.

Furthermore, as the second metal oxide, one kind may be used, but also multiple kinds may be used. In other words, as described below, when it is added to a precursor liquid of the first metal oxide, plural kinds including different element compositions may be used, and the plural kinds may be used as the second metal oxide. Then, when the plural kinds are used as the second metal oxide, one kind among them may be formed of the same element composition as that of the first metal oxide, and another kind among them may be formed of an element composition different from that of the first metal oxide. In this case, the first metal oxide may be formed of an element composition that does not contain Pb, and an element composition different from that of the first metal oxide, among the second metal oxide, may be one that contains Pb.

The insulation film 3 formed of such a perovskite type metal oxide has a higher dielectric constant, compared with other insulation films (dielectric films), such as, for example, a silicon oxide film, silicon nitride film, or silicon oxinitride film. Accordingly, the capacitor 1 having this insulation film can be formed to have a larger capacity, or can be miniaturized when it is designed to have a capacity equal to the conventional one.

Next, a method for manufacturing a capacitor in accordance with an embodiment of the present invention is described based on the method for manufacturing the capacitor 1 having such a structure described above. It is noted that the present embodiment is described with reference to an example in which the method for manufacturing a capacitor in accordance with the present invention is applied to manufacture of the capacitor 1 (1a, 1b) in the semiconductor device 50 shown in FIG. 2.

Also, in the present invention, a droplet discharge method refers to a method of forming desired patterns on a substrate by jetting droplets of liquid in the desired patterns, and generally refers to an ink jet method. It is noted that the liquid (droplets) jetted is not a so-called ink used for printed matters, but a liquid that may include various material substances composing each device, and more specifically, substances that can function as a conductive substance or an insulating substance can be enumerated as the material substances.

Figure 3:
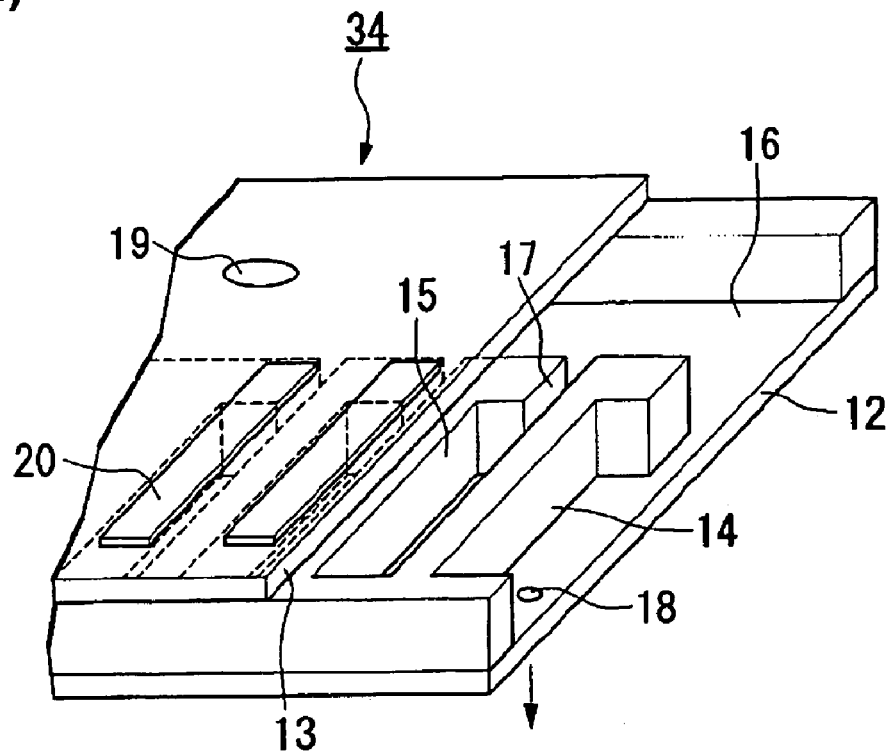
FIG. 3(a) is a perspective view of a main portion of a discharge head.
FIG. 3(b) is a side cross-sectional view of the main portion.
Figure 3:
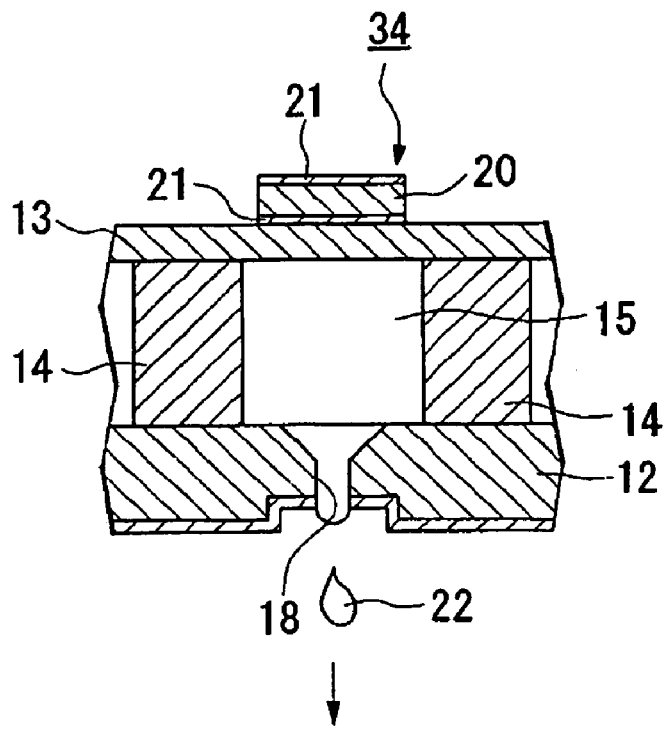

First, prior to concrete descriptions of the method for manufacturing the capacitor 1, one example of a discharge head used in the droplet discharge method is described. As shown in FIGS. 3(a) and 3(b), a discharge head 34 is equipped with a nozzle plate 12 of stainless steel, for example, and a vibration plate 13, which are bonded together through partition members (reservoir plates) 14. A plurality of cavities 15 and a reservoir 16 are formed by the partition members 14 between the nozzle plate 12 and the vibration plate 13, and the cavities 15 and the reservoir 16 communicate with one another through flow paths 17.

Each of the cavities 15 and the reservoir 16 are filled with liquid, and the flow paths 17 between them function as supply ports for supplying the liquid from the reservoir 16 to the cavities 15. Also, the nozzle plate 12 is provided with a plurality of nozzles 18 regularly arranged in length and breadth directions each in the form of a hole for jetting the liquid from the cavity 15. On the other hand, the vibration plate 13 is provided with a hole 19 that opens to the reservoir 16, wherein the hole 19 is connected to a liquid tank (not shown) through a tube (not shown).

Also, a piezoelectric element (piezoelectric device) 20 is bonded to a surface of the vibration plate 13 on the opposite side of a surface thereof facing the cavity 15, as shown in FIG. 3(b). The piezoelectric element 20 is sandwiched between a pair of electrodes 21 and 21, and is formed to flex and protrude outwardly when it is energized.

The vibration plate 13 having the piezoelectric element 20 having such a structure bonded thereto flexes outwardly with the piezoelectric element 20 at the same time, thereby increasing the volume of the cavity 15. Then, as the cavity 15 is communicated with the reservoir 16, and when the liquid is filled in the reservoir 16, the liquid in the amount corresponding to an increased volume flows into the cavity 15 from the reservoir 16 through the flow path 17.

Then, when the piezoelectric element 20 is released from being energized from this state, the piezoelectric element 20 and the vibration plate 13 both return to their original configurations. Accordingly, the cavity 15 also returns to its original volume, such that the pressure of the liquid inside the cavity 15 rises, and a droplet 22 of the liquid is jetted from the nozzle 18.

It is noted that, as a jetting means for the discharge head, systems other than the electromechanical conversion system using the aforementioned piezoelectric element (piezoelectric device) 20 may be adopted. For example, a system that uses an electro-thermo conversion element as an energy generation element, an electrostatic control type, a pressure-vibration type and other continuous systems, an electrostatic absorbing system, and a system in which electromagnetic wave such as laser is irradiated to generate heat, and liquid is jetted by an action caused by the heat generation, may be used.

First Electrode Forming Process

First, as shown in FIG. 4(a), a liquid containing metal fine particles is deposited at a desired position on the substrate 53 (on the interlayer insulation film 52), in other words, on the embedded wiring 5 by using a droplet discharge method (ink jet method) using the discharge head 34 described above. The metal fine particles contained in the liquid, in other words, metal fine particles of the material for forming the lower electrode 2 may be formed of one kind or plural kinds selected from platinum, indium, ruthenium, gold and silver, and the metal fine particles are dispersed in a dispersion medium thereby being adjusted as a liquid. The sizes of the metal fine particles may preferably be between 50 nm and 0.1 μm, and by setting them in this range, they can be readily dispersed in the dispersion medium, and the jetting property thereof when jetted from the discharge head 34 becomes excellent. It is noted that the surfaces of the metal fine particles may be coated with an organic substance or the like in order to improve the dispersion property thereof in the dispersion medium.

The dispersion medium for dispersing the metal fine particles may preferably have a vapor pressure at room temperature between 0.001 mmHg and 200 mmHg. If the vapor pressure of the dispersion medium is greater than 200 mmHg, the dispersion medium is instantly vaporized when a coated film is formed through ejection, which may make the forming of a preferable coating film difficult. On the other hand, if the vapor pressure of the liquid dispersion medium is less than 0.001 mmHg, the dispersion medium may remain in the coated film because drying takes a long time, and a high-quality conductive film may not be obtained after the heat and/or optical treatment in a later step. Also, in particular, the vapor pressure of the liquid dispersion medium may preferably be 50 mmHg or less, because the nozzles may not easily become clogged due to drying in the case in which liquid droplets are ejected from the discharge heads 34, and stable ejection becomes possible.

The solvent to be used is not limited to a specific type as long as it is possible to disperse the aforementioned metal fine particles without causing aggregation. More specifically, the solvent may be, for example, an alcohol group such as methanol, ethanol, propanol, or butanol; a hydrocarbon solvent such as n-heptane, n-octane, decane, toluene, xylene, cymene, durene, indene, dipentene, tetrahydronaphthalene, decahydronaphthalene, or cyclohexylbenzene; an ether solvent such as ethyleneglycol dimethyl ether, ethyleneglycol diethyl ether, ethyleneglycol methyl ethyl ether, diethyleneglycol dimethyl ether, diethyleneglycol diethyl ether, diethyleneglycol methyl ethyl ether, 1, 2-dimethoxyethane, bis (2-methoxyethyl) ether, or p-dioxane; or a polar solvent such as propylene carbonate, γ-butyrolactone, N-methyl-2-pyrrolidone, dimethyl formamide, dimethyl sulfoxide, or cyclohexanone. In the above group, an alcohol group, a hydrocarbon solvent, and an ether solvent are preferred, and a more preferred solvent is a hydrocarbon dispersion medium in view of the dispersion performance of the metal fine particles, stability of the dispersion liquid, and ease of application to the ink-jet method. Of these dispersion mediums, one medium may be used alone, or a mixture of two or more mediums may be used.

When the metal fine particles are dispersed in a dispersion medium to form a dispersion liquid, the concentration of the metal fine particles in the dispersion liquid may preferably be set in a range between 1 weight % and 80 weight %, and it may preferably be adjusted within this range depending on the film thickness of the metal film (lower electrode 2) to be formed. It is noted that when the concentration exceeds 80 weight %, aggregation of metal fine particles tends to occur, and it is difficult to obtain a uniform coated film. If the concentration is less than 1 weight %, the effects of promotion of crystallization and adjustment of the dielectric constant of the dielectric film are not sufficiently obtained.

It is noted that a very small amount of a surface tension modifier such as a fluorine system, silicone system, or nonion system may preferably be added to the dispersion liquid containing metal fine particles to an extent that does not damage the targeted functions.

The surface tension modifier of a nonion system improves wettability of the dispersion liquid with respect to the target coating object, improves the leveling property of the coated film, and contributes to the prevention of spots and small irregularities in the coated film. The viscosity of the dispersion liquid containing metal fine particles that is adjusted by adding the surface tension modifier of a nonion system may preferably be set in a range between 1 mPa·s and 50 mPa·s. When the viscosity is less than 1 mPa·s, portions around the nozzles of the droplet discharge head 34 tend to become dirty due to discharged liquid flowing out, and when the viscosity is greater than 50 mPa·s, the nozzles may frequently become clogged.

Furthermore, the surface tension of the dispersion liquid containing metal fine particles thus adjusted may preferably be set in a range between 20 dyn/cm and 70 dyn/cm. When the surface tension is less than 20 dyn/cm, the trajectory of the liquid tends to curve because the wettability of the ink composition with respect to the nozzle surface is increased, and when the surface tension exceeds 70 dyn/cm, it is difficult to control the amount of ejection and the timing of ejection of the ink composition because the shape of the meniscus at the nozzle end is not stable.

Figure 4:
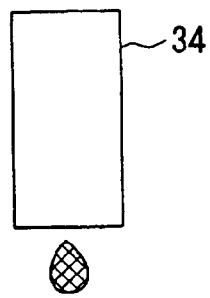
FIGS. 4(a)–(d) are side cross-sectional views for describing a method for manufacturing a capacitor.
Figure 4:
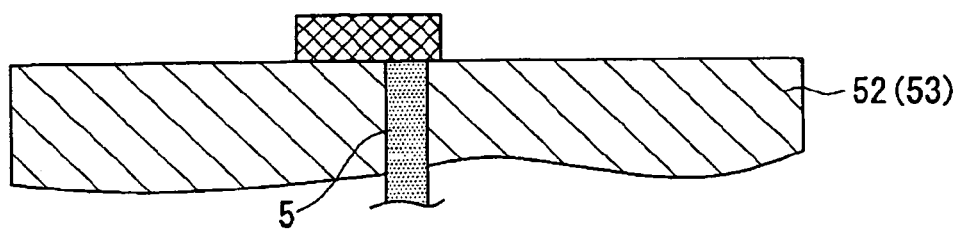
Figure 4:
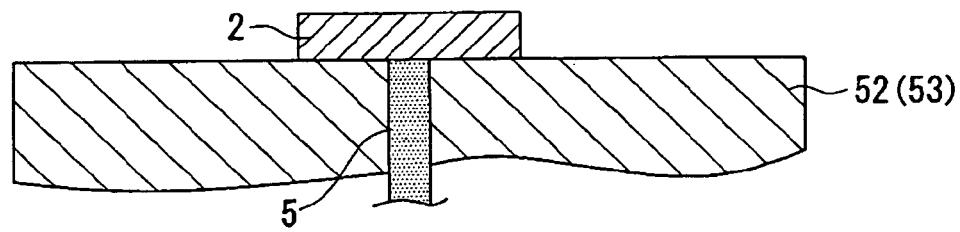
Figure 4:
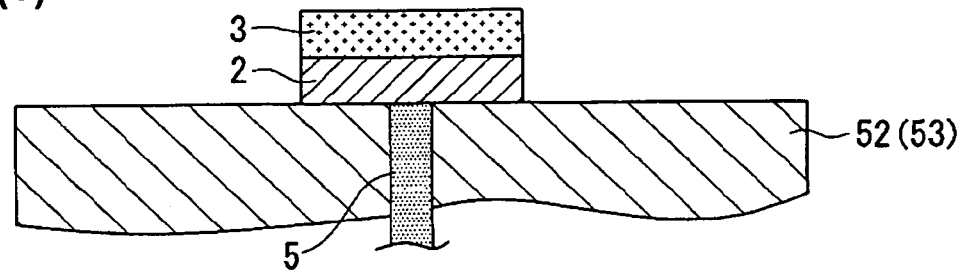
Figure 4:
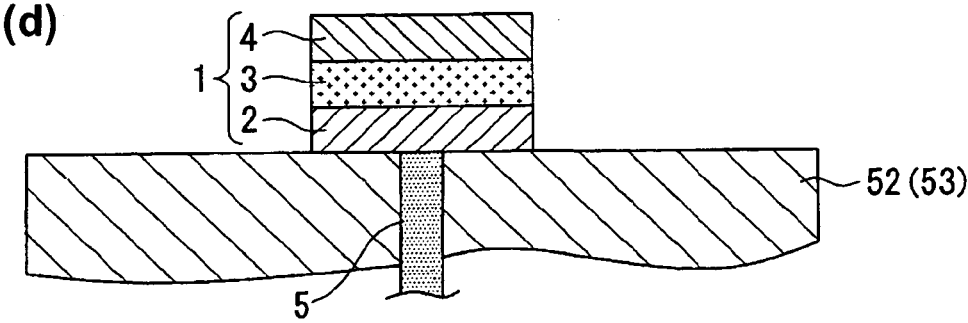

The dispersion liquid containing metal fine particles is deposited at a desired position on the interlayer insulation film 52 by the discharge head 34, and when a predetermined pattern is coated with the dispersion liquid containing metal fine particles, the substrate 53 is heated to apply a heat treatment to the dispersion liquid containing metal fine particles. As a result, the dispersion medium is removed from the dispersion liquid containing metal fine particles, and further the metal fine particles are sintered, such that the lower electrode 2 with the fine particles having sufficiently preferred electrical contacts is formed, as shown in FIG. 4(*b*).

The heat treatment may not be limited to any specific conditions, and ordinary conditions can be used. For example, the heat treatment may be performed under an air atmosphere as the heat treatment atmosphere, or in an inert gas atmosphere such as nitrogen, argon, or helium, if necessary. The temperature at which the heat treatment is performed is appropriately determined taking into consideration the boiling point (vapor pressure) of the dispersion medium, pressure, and the thermal behavior of the metal fine particles, but in particular, may preferably be 400° C. or lower. By setting the temperature at 400° C. or lower, when other semiconductor elements, Al wirings, and protection layers and insulation layers composed of resin are formed on the substrate 53, thermal influences thereon can be sufficiently reduced.

The heat treatment may be performed by a conventional heating process using, for example, a hot plate, an electric furnace, or the like. Other than such a conventional heating process, it can be performed by a lamp annealing process. For example, when the heat treatment is conducted with a hot plate or an electric furnace, the heat treatment temperature may be, for example, 300° C., and the treatment time may be 30 minutes. When the lower electrode 2 is formed under such conditions, the lower electrode 2 to be obtained has, for example, a thickness of about 0.1 μm.

Also, the light source for the lamp annealing process is not limited, and an infrared lamp, a xenon lamp, a YAG laser, an argon laser, a carbon dioxide laser, an excimer laser such as XeF, XeCl, XeBr, KrF, KrCl, ArF, ArCl, or the like may be employed. In general, the output power of such a light source is set to be in a range between 10 W and 5000 W, and in the case of the present embodiment, 100 W to 1000 W may be sufficient.

Insulation Film Forming Process

Next, the insulation film 3 is formed by a liquid phase method based on a sol-gel method.

First, to prepare forming materials of the insulation film 3 to be formed, in other words, a dispersion liquid used in the sol-gal method, a liquid containing a precursor compound of the first metal oxide, and fine crystal powder of the second metal oxide are prepared. The first metal oxide is a main component of the insulation film 3, and is formed of one type selected from lead titanate system materials, such as, $PbTiO_3$, $PbZrTiO_3$ (PZT), $PbLaZrTiO_3$, $PbZrTiNbO_3$, $PbZrTiTaO_3$, and $PbZrTiVO_3$, non-lead system metal oxides, such as, $BaTiO_3$, $SrTiO_3$, $CaTiO_3$, $BaSrTiO_3$, and BaCaTiO, furthermore, strontium bismuth tantalate (SBT) system materials, and bismuth titanate (BIT) system materials.

As the liquid containing a precursor compound of the first metal oxide, a metal alkoxide of each of the constituent metals in the metal oxide selected is basically used as the precursor compound. However, when a metal alkoxide cannot be used for some reasons, for example, because it is insoluble in a solvent, another suitable metal organic compound (for example, metal acetylacetonate, metal carboxylate), or a metal inorganic -compound (nitrate, oxychloride, chloride) may be used as the precursor compound. The mixing ratio of constituent metals is basically a stoichiometric ratio. However, when a lead titanate system material such as PZT or the like is used as the first metal oxide, lead may preferably be added in an excess of about 10% with respect to the stoichiometric ratio, because a pyrochlore phase would likely be generated, or lead would readily evaporate.

A perovskite type metal oxide is a complex metal oxide. Accordingly, when an oxide formed of two or more kinds of metal is formed, there is a possibility that a specific metal alkoxide may be selectively hydrolyzed faster than other metal alkoxides. This may possibly deteriorates the advantages of the sol-gel method such as the composition controllability, compound material forming property and the like. Therefore, to form a complex metal oxide uniformly, a 2-metal alkoxide, 3-metal alkoxide, etc. which concurrently contains plural types of constituent metals in molecules, may preferably be used. If such a metal alkoxide is used, two or more kinds of metals form oxide particles in a state in which they are mixed in an atomic level when molecules are hydrolyzed, such that the resultant material becomes homogeneous in the order of angstroms.

For preparing the solution, first, an appropriate solvent is selected according to the precursor compound of the first metal compound to be used.

In general, when a metal alkoxide is used, alcohol is used as a solvent. However, when a metal alkoxide used is insoluble in alcohol, the solution may be prepared by using carboxylic acid, carboxylic acid ester or a mixed solution of these acids. Also, water necessary for hydrolysis and acid or base as a catalyst may be added to the obtained metal alkoxide (precursor compound) solution, thereby forming a liquid containing a precursor compound of the first metal oxide. As a result, molecules form a network through hydrolysis and polycondensation, such that lowering of the crystallization temperature, improvement of the morphology of a film at the time of film growth can be expected. The acid or base added also has a function to form a homogeneous solution by preventing generation of precipitation and separation of a liquid phase (peptization function). It is noted that its pH may be adjusted to 7 or higher without adding acid, or by adding base instead of acid. Also, an additive such as acetylacetone, formaldehyde, etc. may be added according to the purpose.

The second metal oxide is prepared as a dispersion liquid used for the sol-gel method through adding and dispersing fine powder of its crystal in the above-described liquid. The second metal oxide may be the same material as the first metal oxide as described above, or may be a different material. In other words, the lead titanate system materials, non-lead system metal oxides, as well as, SBT system materials, and BIT system materials described above may favorably be used as the second metal oxide. Furthermore, not only one kind, but also plural kinds may be used as the second metal oxide.

Figure 5:
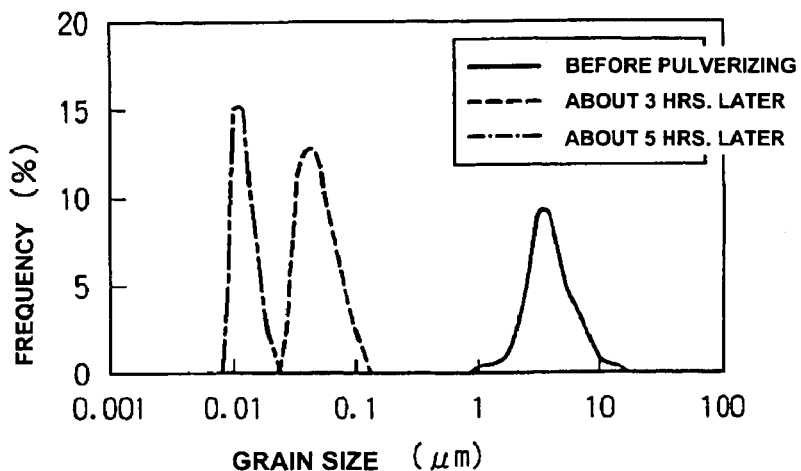
FIG. 5 is a graph for describing changes in the grain size distribution when crystal mass is finely pulverized.

To form such fine crystal powder of the second metal oxide, a precursor solution of the target perovskite type metal oxide is dried, and then is subject to a sintering treatment to thereby obtain bulk of metal oxide. Then, the bulk is pulverized by a pulverizer into fine power of crystal that is arranged in the desired grain size, for example, the grain size of the order of nanometer or submicron. The grain size of the fine crystal powder can be appropriately adjusted by controlling the processing time of the pulverizer. For example, powder in which its grain size is distributed within the range of 1–10 μm is prepared by the sintering process, as shown in FIG. 5. At this time, the formed crystal may be coarsely pulverized if necessary, to arrange the grain size within the above-described range. Then, the powder having the grain size of 1–10 μm is finely pulverized by a pulverizer to thereby obtain fine powder of the desired grain size. For example, as shown in FIG. 5, the grain size can be arranged in about 0.03–0.15 μm by performing the fine pulverizing process for about three hours, and further, the grain size can be arranged in about 0.01–0.03 μm by performing the fine pulverizing process for about five hours.

It is noted that the average grain size of fine crystal powder to be formed may preferably be 80% or less of the thickness of the insulation film 3 to be formed, and more preferably, 50% or less. As a result, crystal fine particles in the insulation film 3 to be formed are prevented from being exposed on the film surface, and the flatness of the insulation film 3 can be prevented from being damaged. Also, in particular, when the grain size is 50% or less of the thickness of the insulation film, the preventive effect described above becomes more secured, and the film quality can be stabilized.

The fine crystal powder thus obtained is added to a liquid that contains the precursor compound of the first metal oxide described above, mixed and dispersed, thereby obtaining a dispersion liquid in accordance with the present invention. The mixing ratio of the fine crystal powder to the liquid that contains the above-described precursor compound is arbitrary without being especially limited, but the ratio of fine crystal powder that occupies in the insulation film 3 finally formed may be from 5 weight % to about 50 weight % in weight ratio. When it is less than 5 weight %, the effect to be caused by addition of fine crystal powder is not sufficiently obtained, and when it exceeds 50 weight %, its dispersion property within the dispersion liquid becomes deteriorated, and the film quality of the insulation film 3 obtained may become uneven.

It is noted that the fine particles of crystal may be directly dispersed unaltered in the above-described liquid, but they may be treated by coating with coats of organic substance, to increase their dispersion property and prevent aggregation.

When the dispersion liquid is formed with addition of fine crystal powder of the second metal oxide, and is used to form the insulation film 3 as described below, crystallization of the precursor compound of the first metal oxide to the first metal oxide is promoted, or the relative dielectric constant of the insulation film 3 to be obtained can be adjusted. The mechanism of promotion of the crystallization may differ depending on the relation between the first metal oxide and the second metal oxide, and their kinds.

First, when the same material as the first metal oxide is used, in other words, when fine crystal powder having the same composition as the element composition of the first metal oxide is used, the fine crystal powder becomes a seed crystal, whereby crystallization of the precursor compound in the dispersion liquid to the first metal oxide is quickened, such that the crystallization is promoted. More specifically, when Pb $(Zr_{0.4}Ti_{0.6})$ $O_3$ is used as both of the first metal compound and the second metal compound, crystallization by sintering at 400–450° C. becomes possible as described below and, as a consequence, crystallization is promoted.

Moreover, when a material different from the first metal oxide is used as the above-described fine crystal powder, the relative dielectric constant of the insulation film 3 to be obtained can be adjusted by appropriately selecting the element composition of the fine crystal powder. That is, the relative dielectric constant of an insulation film is almost decided depending on the kind of insulator (dielectric substance). Therefore, in order to make a capacitor having a target capacitance, it is a general practice to adjust the capacitance by changing the film thickness and/or area of its insulation film.

Accordingly, in the present invention, in particular, fine crystal powder with an element composition different from that of the first metal oxide is used, and the element composition and/or the amount thereof are selected, such that the relative dielectric constant of the insulation film 3 to be obtained can be adjusted. More specifically, when the first metal oxide is PZT, fine crystal powder of $BaTiO_3$ can be used as the fine crystal powder. By adjusting the relative dielectric constant of the insulation film 3 in this manner, insulation films 3 (dielectric films) having the same film thickness and area can be formed to have different capacitances. It is noted that the kind of crystal of the fine crystal powder may be arbitrary without being particularly limited.

Also, when a material different from the first metal oxide is used as the fine crystal powder, not only the relative dielectric constant of the insulation film 3 to be obtained can be adjusted, but also crystallization of the precursor compound of the first metal oxide to the first metal oxide can be promoted. For example, when the first metal oxide described above is formed of an elemental composition that does not include Pb, fine crystal powder of the second metal oxide that is formed of an element composition including Pb may be used, whereby crystallization to the first metal oxide can be promoted.

More specifically, fine crystal powder of $PbTiO_3$ (second compound) is dispersed in a liquid that contains a precursor compound of $BaSrTiO_3$ (first compound), and the dispersion liquid obtained may be heat-treated. As a result, the crystallization temperature at the time of crystallizing the precursor compound of the first metal oxide, in other words, the sintering temperature can be lowered than the original temperature (sintering temperature of $BaSrTiO_3$) and, as a consequence, the crystallization can be promoted. Moreover, although $BaTiO_3$ (barium titanate) has a high relative dielectric constant, but is not crystallize unless its sintering temperature is elevated to a high level, compared with $PbTiO_3$ (lead titanate) and Pb $(Zr_xTi_{1-x})$ $O_3$ (lead titanate zirconate). Accordingly, when the first metal oxide is $BaTiO_3$, fine crystal powder of a lead-system metal oxide may be used and dispersed therein, such that the crystallization temperature can be lowered, and therefore the crystallization is promoted and the sintering process can be completed in a short time.

Not only one kind of fine crystal powder of the second metal oxide, but multiple kinds thereof can be used together. In this case, one kind among the multiple kinds used may be formed of the same element composition as that of the first metal oxide, and another kind among them may be formed of an element composition different from that of the first metal oxide. As a result, by the one kind having the same element composition as that of the first metal oxide, crystallization of the precursor compound to the first metal oxide is quickened, and therefore the crystallization is promoted. Also, by the other kind having the element composition that is different from that of the first metal oxide, the relative dielectric constant of the insulation film 3 to be obtained can be adjusted, in particular, by appropriately selecting the element composition and/or the amount thereof. More specifically, when the first metal oxide is PZT, PZT and $BaTiO_3$ can be used together as fine crystal powder (second compound). In this case, crystallization can be promoted particularly by PZT as the fine crystal powder, and the relative dielectric constant of the insulation film 3 to be obtained can be adjusted by $BaTiO_3$. Also, the fine crystal powder that is added for the purpose of adjusting the relative dielectric constant of the insulation film 3 may be formed of one kind or a plurality of kinds.

In this manner, the fine crystal powder is added in the liquid containing the precursor compound of the first metal oxide, mixed and dispersed therein, to prepare the dispersing liquid. The dispersion liquid is then disposed (coated) by the discharge head 34 on the lower electrode 2 to a uniform thickness.

Then, the liquid is dried for a predetermined time at a predetermined temperature, to thereby remove liquid contents from the dispersion liquid. Further, after this drying step, a degreasing step is conducted under an air atmosphere at a predetermined high temperature (for example, 450° C.) for a predetermined time (for example, 30 minutes), thereby thermally decomposing organic components coordinated with metals, and oxidizing the metals into metal oxides. Such coating→drying→degreasing steps are repeated a predetermined time, to form the metal oxides to a desired thickness.

Thereafter, a heat treatment is conducted in a RTA (Rapid Thermal Annealing) furnace while flowing oxygen at a predetermined temperature, for example, at 450° C. or below, more preferably, between 400° C. and 450° C., thereby sintering the metal oxides to form the insulation film 3 to a thickness of about 0.2 μm on the lower electrode 2, as shown in FIG. 4 (c). As described above, because the dispersion liquid is formed with fine crystal powder added, the fine crystal powder becomes a seed crystal such that crystallization is promoted, and therefore crystallization at 450° C. or below becomes possible. By conducting the heat treatment at 450° C. or below, particularly when other semiconductor elements and wirings are formed on the substrate 53, thermal influences thereon can be reduced. It is noted that the heat treatment is not limited to the one with a RTA furnace. Also, the dispersion liquid can be coated by a spin coat method, a dip method or the like, without being limited to the droplet discharge method.

When the insulation film 3 is formed with the liquid in a sol state in a manner described above, the liquid wet-spreads when jetted, and is difficult to form a desired configuration, in other words, a configuration that generally covers the entire surface of the lower electrode 2.

Accordingly, prior to forming the insulation film 3 described above, a self-organizing film using, for example, fluoroalkylsilane may preferably be formed on a surface of the substrate 53 (interlayer insulation film 52) where the lower electrode 2 is formed, thereby forming a liquid-repelling portion that has a low affinity to the liquid in a sol state.

Liquid-repelling Portion Forming Process

Figure 6:
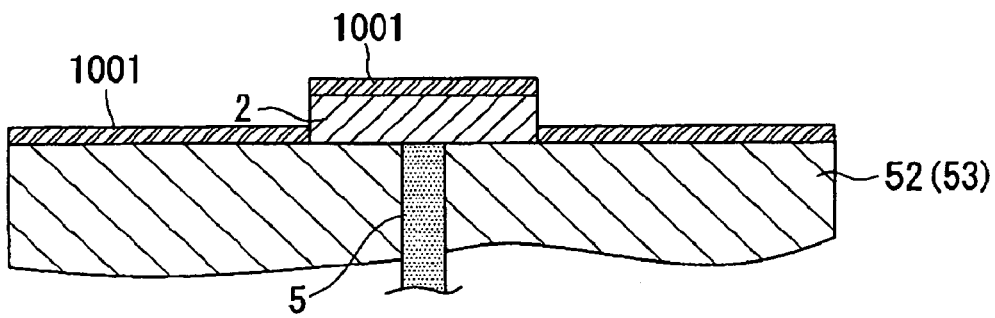
FIG. 6 is a side cross-sectional view for describing an example in which a liquid-repelling portion is formed.

To form the liquid-repelling portion, a self-organizing film 1001 composed of fluoroalkylsilane or the like to have a predetermined contact angle with respect to the liquid in a sol state is formed, as shown in FIG. 6, on the surface of the substrate 53, in other words, on the surface of the lower electrode 2 and on the exposed surface of the interlayer insulation film 52. The contact angle may preferably be 30 degrees or greater but 60 degrees or smaller.

An organic molecular film for treatment of the surfaces of the lower electrode 2 and the interlayer insulation film 52 includes a first functional group that can be bound with the surfaces, a second functional group for reforming the surface (i.e., controlling surface energy) of the substrate such as a group having liquid-affinity, a liquid-repellent group, or the like disposed at the side opposite to the first functional group, and a straight carbon chain or a partially branching carbon chain that binds the first and second functional groups together. The organic molecular film binds with the respective surfaces and self-organizes so as to form a molecular film such as a monomolecular film.

The self-organizing film 1001 herein referred to includes a functional group that is to react with constituent atoms of a backing layer that is the lower electrode 2 and the interlayer insulation film 52, and other straight chain molecules, and is formed by orienting compounds that have an extremely high orientation due to interaction between the straight chain molecules. Because the self-organizing film 1001 is formed by orienting single molecules, an extremely small film thickness can be obtained, and in addition, the film is, quite uniform as observed on the scale of molecular size. Also, because the same type of molecules is positioned at the surface of the film, a uniform and superior liquid-repellency or liquid-affinity may be provided on the surface of the film.

As the compound having a high orientation, in other words, as the compound for forming the self-organizing film 1001, fluoroalkylsilane (FAS) is preferably used because it demonstrates a good bonding property with the substrate 53 and contributes to good liquid-repellency. By using fluoroalkylsilane, each of the compounds is oriented such that each fluoroalkyl group thereof is positioned at the surface of the film so that the self organizing film 1001 is formed, and thus a uniform liquid-repellency is provided on the surface of the film.

As the fluoroalkylsilane described above, for example, heptadecafluoro-1, 1, 2, 2-tetrahydrodecyltriethoxysilane, heptadecafluoro-1, 1, 2, 2-tetrahydrodecyltrimethoxysilane, heptadecafluoro-1, 1, 2, 2-tetrahydrodecyltrichlorosilane, tridecafluoro-1, 1, 2, 2-tetrahydrooctyltriethoxysilane, tridecafluoro-1, 1, 2, 2-tetrahydrooctyltrimethoxysilane, tridecafluoro-1, 1, 2, 2-tetrahydrooctyltrichlorosilane, or trifluoropropyltrimethoxysilane may preferably be used. Of these compounds, one compound (FAS) may be used alone, or two or more compounds (FAS) may be combined and used.

To form the self-organizing film 1001, the above-mentioned source compounds (FAS) and the substrate 53 are placed in a sealed container. After leaving them to stand for 2 to 3 days at room temperature, the self-organizing film 1001 is formed on the substrate 53. Alternatively, by maintaining the entire sealed container at 100° C., the self-organizing film 1001 is formed on the substrate 53 in approximately 3 hours.

Also, instead of the forming method using a gas phase, the self-organizing film 1001 may be formed from a liquid phase. For example, the self-organizing film 1001 can be formed on a substrate through the steps of dipping the substrate in a solution containing the source compounds, and rinsing and drying the substrate.

It is noted that, before forming the self-organizing film 1001, a pretreatment may preferably be applied to the surface of the substrate through irradiating ultraviolet light to the surface of the substrate, or cleaning the surface of the substrate using a solvent.

In this manner, by making the surface of the lower electrode 2 and the surface of the interlayer insulation film 52 liquid-repellent, and in particular, by making the liquid in a sol state disposed on the surface of the lower electrode 2 difficult to wet-spread, the liquid is prevented from spreading into the surface of the interlayer insulation film 52 and forming a film there, such that the insulation film 3 obtained can be prevented from substantially differing from the desired configuration.

It is noted that, to form the insulation film 3 in a desired configuration, in other words, in a configuration that generally entirely covers the lower electrode 2, a liquid-repelling portion may be formed on the surface of the interlayer insulation film 52 (substrate 53) at least around the lower electrode 2. Further, the surface of the lower electrode 2 may preferably be formed as a lyophilic portion (a portion having a high affinity to the liquid in a sol state), instead of forming it as a liquid-repelling portion.

To make the surface of the lower electrode 2 to be a lyophilic portion, ultraviolet light or the like is irradiated to the self-organizing film 1001 through a mask (not shown) having a desired pattern, in other words, an opening pattern corresponding to the surface configuration of the lower electrode 2 formed therein. As a result, the self-organizing film 1001 in a region irradiated with ultraviolet light is removed, and for example, a hydroxyl group is exposed on the surface, which becomes a lyophilic portion that exhibits a very high wettability compared to the FAS region.

Also, a second self-organizing film may be formed in the above-described region where the FAS is removed. A compound for forming the second self-organizing film also includes a functional group for bonding and a functional group for reforming the surface, like FAS, wherein the functional group for bonding bonds with the hydroxyl group or the like at the substrate surface, to form the self-organizing film. However, the functional group of the second self-organizing film for reforming the surface may be the one that exhibits, unlike FAS, a lyophilic property, or has a strong bonding force with metal fine particles, such as, for example, an amino group or a thiol group. By forming the second self-organizing film described above, the liquid in a sol state described above can be more securely disposed on the lower electrode 2, and the insulation film 3 in a desired configuration can be formed. Also, the bonding force of the obtained insulation film 3 to the lower electrode 2 is enhanced. As the compounds for forming the second self-organizing film described above, 3-mercaptopropyltriethoxysilane, 3-mercaptopropyltrimethoxysilane, 3-aminopropyltriethoxysilane, 3-aminopropyltrimethoxysilane, and the like can be enumerated.

Upper Electrode Forming Process

When the portion up to the insulation film 3 is formed in the manner described above, then an upper electrode 4 is formed on the insulation film 3, as shown in FIG. 4(*d*). The upper electrode 4 can be formed by generally the same forming method as the method for forming the upper electrode 2 described above. In other words, by a droplet discharge method (an ink jet method) using the discharge head 34 described above, a liquid containing metal fine particles is deposited on the insulation film 3, and then a heat treatment is conducted to sinter the metal fine particles, to form the upper electrode 4. Through the above processes, the capacitors 1 (1*a*, 1*b*) can be obtained.

As the metal fine particles contained in the liquid, in other words, the metal fine particles that are materials for forming the upper electrode 4, one kind or plural kinds selected from platinum, iridium, ruthenium, gold and silver may be used, like in the case of the lower electrode 2. Also, the heat treatment may preferably be conducted, in particular, at 400° C. or below.

It is noted that, prior to forming the upper electrode 4, a liquid-repelling portion forming step, which is conducted as a pretreatment before the insulation film 3 is formed, may be conducted. More specifically, a liquid-repelling portion composed of fluoroalkylsilane (FAS), like the one described above, is formed on the surface of the insulation film 3 and the surface of the interlayer insulation film 52, thereby selectively forming the upper electrode 4 on the insulation layer 3 while preventing the liquid from wet-spreading. Also, prior to forming the lower electrode 2 described above, a liquid-repelling portion may be formed on the surface of the substrate 53 (interlayer insulation film 52). Further, when a liquid-repelling portion is formed as a pretreatment before forming each of the electrodes 2 and 4, portions where the liquid is directly applied may be changed to lyophilic portions by irradiation of ultraviolet light or the like, as described above.

Also, the lower electrode 2 and the upper electrode 4 may be formed by using a vapor deposition method, a sputter method or the like, instead of using the droplet discharge method as a method for forming thereof.

When the upper electrode 4 is formed, wirings to be connected to the upper electrode 4, and a protection film and an insulation film that are to cover them are formed, whereby the semiconductor device 50 is obtained.

In the method for manufacturing the capacitor 1 described above, fine crystal powder of the second metal oxide is dispersed in a liquid containing the precursor compound of the first metal oxide, and the dispersion liquid is coated on the lower electrode 2, to thereby form the insulation film 3. As a result, when the dispersion liquid is heat-treated and crystallized to form an insulation film formed of a perovskite type metal oxide, the fine crystal powder of the second metal oxide added becomes a seed crystal, such that crystallization of the precursor compound in the dispersion liquid into the first metal oxide is quickened and therefore its crystallization is promoted, or crystallization at low temperatures becomes possible, which, as a consequence, promotes the crystallization. Accordingly, for example, when other semiconductor elements, wirings, and the like are formed on the substrate 53, thermal influences thereon can be reduced and their reliability can be improved.

Also, after the dispersion liquid has been disposed by a droplet discharge method, the same is thermally treated to form the insulation film 3, such that a large-scale film forming apparatus is not required, and the method becomes advantageous also in material usage efficiency and energy consumption, such that the cost can be reduced. Moreover, because patterning by etching is not required as the liquid can be deposited at any desired positions, no damage is caused to the insulation film 3, which may be caused by etching, and its characteristics can be improved. Also, because the insulation film 3 having a high dielectric constant can be formed, as described above, the capacitor 1 can have a greater capacity or can be miniaturized.

Also, in the capacitor 1 thus obtained, in particular, the fine crystal powder is appropriately selected to suitably set the dielectric constant and crystallization temperature (sintering temperature) of the insulation film 3. As a result, for example, by forming the dielectric constant higher, the capacitor 1 can be formed to have a greater capacity. Alternatively, when it is designed to have a capacity equal to a conventional type, device miniaturization can be made possible. Moreover, because the crystallization temperature (sintering temperature) of the insulation film 3 becomes lower, thermal influences on other semiconductor elements, wirings and the like are reduced, as described above, and therefore the reliability of the entire device including these other semiconductor elements, wirings and the like can be improved.

Also, in the semiconductor device 50 equipped with the capacitor 1, because the capacitor 1 has the insulation film 3 having a high dielectric constant and thus its size can be miniaturized, the semiconductor device 50 itself can be miniaturized. Also, in particular, the insulation film 3 is formed by a droplet discharge method, the cost is reduced.

EMBODIMENT EXAMPLE

Next, the present invention is described in greater detail with reference to an embodiment example.

In the present embodiment example, a capacitor 1 shown in FIG. 1 is formed based on a manufacturing method indicated in FIGS. 4(*a*)–(*d*).

First, a liquid containing platinum (Pt) fine particles dispersed therein was jetted by a droplet discharge method using the discharge head 34 to a predetermined position on the interlayer insulation film 52 formed of polyimide on the substrate 53, and a heat treatment was conducted using a hot plate at 300° C. for 30 minutes, whereby a lower electrode 2 was formed in a thickness of about 0.1 μm.

Also, beside the above, a precursor solution (metal alkoxide) of Pb ($Zr_{0.4}Ti_{0.6}$) $O_3$ as the second metal oxide is dried, and heat-treated at 650° C. for two hours to be crystallized, whereby mass of PZT of a perovskite type was obtained. The mass of PZT was finely pulverized, whereby fine crystal powder having the grain size of about 10 nm was obtained. Next, the obtained fine crystal powder is dispersed in a precursor solution (metallic alkoxide) of Pb ($Zr_{0.4}Ti_{0.6}$) $O_3$ as the first metal oxide, whereby a dispersion liquid was obtained. The amount of fine crystal powder in the dispersion liquid was adjusted such that the proportion of the fine crystal powder that occupies in the insulation film 3 to be eventually formed becomes 5 weight %, 10 weight %, 20 weight %, 30 weight %, 40 weight %, and 50 weight % in weight ratio, whereby 6 kinds of dispersion liquids were formed. Also, for comparison, one that consisted of a precursor solution (metallic alkoxide) alone without fine crystal particles added thereto was formed.

Next, the seven kinds of above-described liquids (six kinds of dispersion liquids and one liquid without fine crystal particles added) were disposed on the above-described lower electrodes 2, respectively, by the droplet discharge method with the discharge head 34 described above.

Then, each of the liquids disposed on the lower electrode 2 was subject to drying and degreasing. Then, after a series of steps including liquid coating→drying→degreasing steps was repeated a predetermined time, a heat treatment was conducted at 450° C. while flowing oxygen in a RTA furnace, whereby the PZT formed of the above-described liquid was sintered, and an insulation film 3 having a thickness of about 0.2 μm was formed on the lower electrode 2.

Then, a liquid containing platinum (Pt) fine particles dispersed therein was discharged onto the insulation film 3 by a droplet discharge method, and was further subject to a heat-treatment, thereby forming an upper electrode 4 having a thickness of about 0.1 μm, like the lower electrode 2, whereby the capacitor 1 was obtained.

Figure 7:
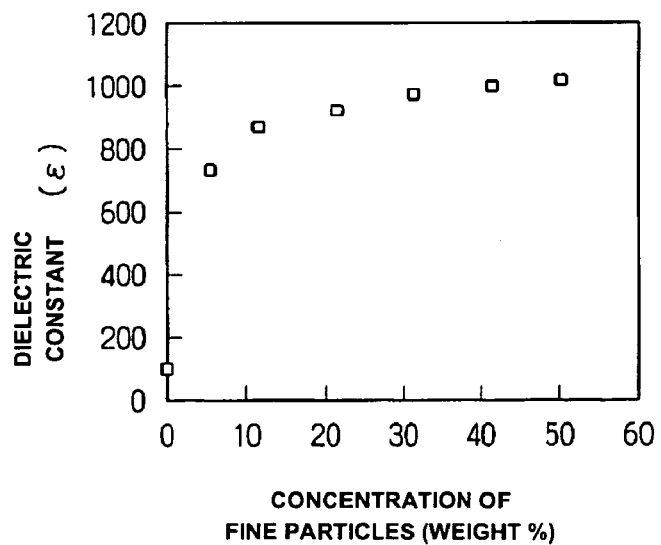
FIG. 7 is a graph showing the relation between the concentration of fine particles of crystal and the dielectric constant.

The dielectric constant ($\epsilon$) of each of the insulation films 3 of the capacitors 1 thus obtained was examined. The results obtained are shown in FIG. 7 as the relation between the concentration of fine particles (weight %) and the dielectric constant ($\epsilon$). It is noted that the result of the insulation film 3 formed from the liquid without crystal fine particles added is also shown in FIG. 7.

It is observed from FIG. 7 that, while the dielectric constant of the insulation film 3 formed from the liquid without crystal fine particles added was about 100, those with the crystal fine particles added in a concentration of 10 weight % or greater exhibited high values which were 800 and above. Also, the one with crystal fine particles added in a concentration of 5 weight % drastically improved its dielectric constant.

Accordingly, it was confirmed that insulation films having a high dielectric constant can be obtained by sintering at low temperatures in accordance with the present invention.

Moreover, in the embodiment examples, a dispersion liquid was prepared such that the proportion of the fine crystal powder that occupies in the insulation film 3 to be eventually formed becomes 10 weight % in weight ratio, and the dispersion liquid was sintered while changing the sintering temperature between 350° C. and 550° C., whereby corresponding insulation films 3 were obtained.

The dielectric constant ($\epsilon$) of each of the insulation films 3 thus formed was examined. The results obtained are shown in FIG. 8 as the relation between the sintering temperature and the dielectric constant ($\epsilon$).

Figure 8:
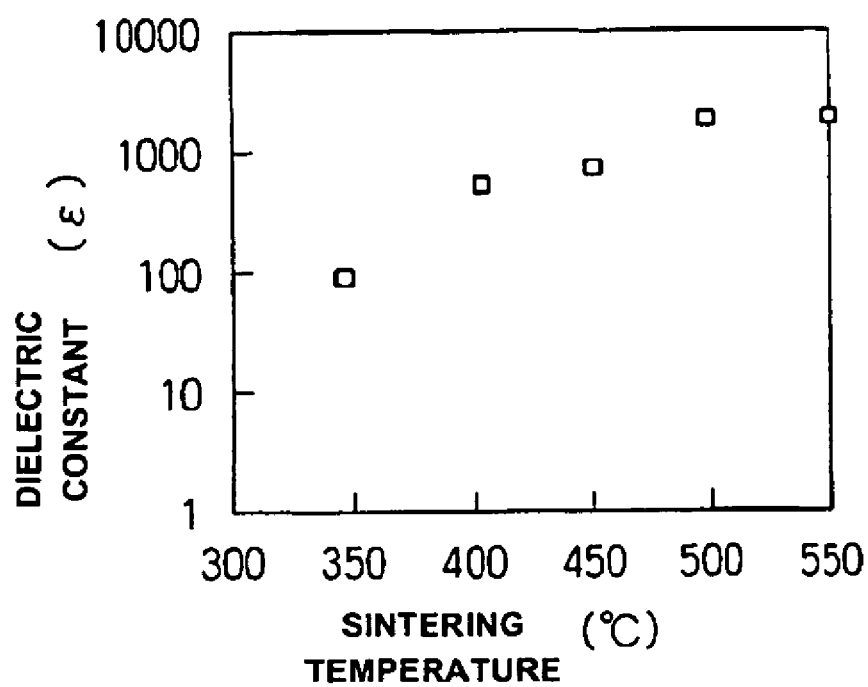
FIG. 8 is a graph showing the relation between the sintering temperature and the dielectric constant of insulation films obtained.

It is observed from FIG. 8 that, when the sintering temperature was set at 500° C. or higher, high dielectric constants that exceeded 1000 were obtained. These insulation films were subject to X-ray analysis and voltage-hysteresis measurements. As a result, perovskite phase and hysteresis, which are characteristic of ferroelectric substance, were observed, and it was found that their remanence exhibited great values. It is not suitable to use a ferroelectric having such a large remanence as an insulation film of a capacitor.

On the other hand, those obtained at sintering temperatures between 400° C. and 450° C. also had characteristics indicating the ferroelectric property, but their remanence reached values that are less than half of those obtained at 500° C., and their hysteresis became slimmer than those sintered at 500° C. It is considered that this happened because crystallization was not completely advanced, and amorphous phases also existed. When they are used in capacitors, it is desirous that their remanence is small, and it was found that in those examples, the sintering temperature should preferably be between 400° C. and 450° C.

As described above, a capacitor in accordance with the present invention includes an insulation film that has a relatively high dielectric constant. Accordingly, by using the same as a capacitor inside a circuit in place of a conventional type, a semiconductor device to be obtained can achieve a higher performance and a size-reduction. Also, by using the same as a capacitor attached external to a circuit, a higher performance and a size-reduction of a semiconductor device can also be achieved. Furthermore, although the required capacitances of capacitors to be used inside a circuit and attached external to a circuit may be different, the dielectric constants of insulation films to be obtained can be controlled by appropriately selecting the kind and the amount of fine crystal powder, and the sintering temperature. Therefore, capacitors in accordance with the present invention can be applied to both of the types. It is noted that, when the sintering temperature is used for control, one requiring a higher sintering temperature may preferably be formed first.

Also, in particular, by forming them by a droplet discharge method, different types can be individually formed on the same plane. Accordingly, capacitors used inside circuits and capacitors attached externally to circuits of conventional types described above can be readily manufactured at low costs.

It goes without saying that, in accordance with the method for manufacturing a capacitor, its dielectric constant may be controlled by changing the film thickness and area of its insulation film, and further, electrodes and dielectric films may be alternately laminated, whereby a capacitor having a greater capacitance can be formed.

What is claimed is:

1. A method for manufacturing a capacitor characterized in comprising the steps of:
    forming a lower electrode on a substrate;
    forming an insulation film formed of a perovskite type metal oxide on the lower electrode; and
    forming an upper electrode on the insulation film,
    wherein the step of forming the insulation film includes the steps of coating a dispersion liquid in which fine crystal powder of a second metal oxide of a perovskite type in a liquid containing a precursor compound of a first metal oxide of a perovskite type on the lower electrode, and heat-treating the dispersion liquid after coating.

2. A method for manufacturing a capacitor according to claim 1, wherein an element composition of the first metal oxide is equal to an element composition of the fine crystal powder of the second metal oxide.

3. A method for manufacturing a capacitor according to claim 1, wherein an element composition of the first metal oxide is different from an element composition of the fine crystal powder of the second metal oxide.

4. A method for manufacturing a capacitor according to claim 3, wherein the first metal oxide is formed of an element composition that does not include Pb, and the second metal oxide is formed of an element composition that includes Pb.

5. A method for manufacturing a capacitor according to claim 1, wherein the fine crystal powder of the second metal oxide includes fine crystal powder of a metal oxide having an element composition identical with the element composition of the first metal oxide, and fine crystal powder of a metal oxide having an element composition different from the element composition of the first metal oxide.

6. A method for manufacturing a capacitor according to claim 1, wherein the first metal oxide is formed of an element composition that does not include Pb, and the fine crystal powder of the metal oxide having the element composition different from the element composition of the first metal oxide, among the fine crystal powder of the second metal oxide, has an element composition that includes Pb.

7. A method for manufacturing a capacitor according to claim 1, wherein an average grain size of the fine crystal powder of the second metal oxide is 80% or less of a thickness of the insulation film to be formed.

8. A method for manufacturing a capacitor according to claim 1, wherein the step of coating the dispersion liquid on the lower electrode is performed by discharging the dispersion liquid by a droplet discharge method to dispose the dispersion liquid on the lower electrode.

* * * * *